United States Patent [19]

Heil

[11] 3,958,848
[45] May 25, 1976

[54] METHOD OF FABRICATING FIELD DESORPTION ION SOURCE

[76] Inventor: Hans W. Heil, 380 Rambla Orienta, Malibu, Calif. 94035

[22] Filed: Mar. 31, 1975

[21] Appl. No.: 563,798

Related U.S. Application Data

[62] Division of Ser. No. 481,785, June 21, 1974, Pat. No. 3,911,311.

[30] Foreign Application Priority Data

July 3, 1973 Germany............................ 2333866

[52] U.S. Cl. ................................. 316/26; 29/25.18
[51] Int. Cl.² .......................................... H01J 9/02
[58] Field of Search ...................... 29/25.17, 25.18; 316/26, 13; 313/230

[56] References Cited
UNITED STATES PATENTS
2,809,314   10/1957   Herb ................................. 313/230

Primary Examiner—Roy Lake
Assistant Examiner—James W. Davie
Attorney, Agent, or Firm—Robert R. Tipton

[57] ABSTRACT

A gas permeable electrode is arranged to project into an evacuated space with the vacuum side of the electrode coated with a gas impervious material except at the tip of the electrode. The other end of the electrode is exposed to an ionizable gas that is caused to diffuse through the electrode and be ionized at the tip of the electrode on the high vacuum side by an electrical field created between the gas permeable electrode and an extraction electrode in the high vacuum space.

3 Claims, 3 Drawing Figures

METHOD OF FABRICATING FIELD DESORPTION ION SOURCE

CROSS REFERENCE TO RELATED APPLICATION

This application is a division of applicant's prior filed application Ser. No. 481,785, filed June 21, 1974, now Pat. No. 3,911,311.

BACKGROUND OF THE INVENTION

This invention relates generally to ion sources and in particular to field desorption ion sources.

Ion sources, in particular proton sources, with rather homogeneous energy in the emitted beam, that is, beams with good monochromaticity, are needed in microscopes in which ions are used instead of the usual electrons for the purpose of lowering the limit to the resolution set by diffraction effects of the particle beam.

In the past, attempt to use ion beams in high resolution electron microscopes, either conventional transmission or scanning microscopes, were not successful because the available ion sources were not adequate with respect to "brightness". That is, they did not have sufficient target current density per steradian to produce an adequate image.

In addition, the ion sources of the prior art had too broad an energy spread to permit sharp focusing. Where the lack of "brightness" of the prior art devices limited the signal in the image that was to be detected, the broad energy spread of the ions additionally limited the resolution, i.e. the sharpness of the image due to the chromatic aberration of the objective lens.

It is especially important in ions scanning transmission microscopy to have a monchromatic ion source since the image contrast is preferably obtained in this operation by energy analysis of the ions after their passage through the target rather than by selection according to the scattering angle of the beam by means of an aperture.

In the more recently developed instrument called the ion microprobe, secondary ions are used to generate the signal. The limitation here is the signal strength at high resolution. The highest resolution attainable at the moment corresponds to a 1 micron spot diameter of the primary ion beam. To go to a 0.1 micron diameter spot and retain the total spot current, requires a 100 times larger brightness of the primary ion source. For the increased source brightness, the ion source described herein is well suited.

There exist in the prior art, other field-ionization ion sources in which the brightness is adequate, e.g. $10^5$ A $cm^{-2}sr^{-1}$, however, the energy spread in the beam cannot be reduced below 1 eV (H. Heil and R. Guckenberger, Proc. Symp. Ion Sources and Formation of Ion Beams, p. 183, BNL 50310, 1971).

Because field ionization occurs within a narrow range of distances above the electrode tip surface, even though the range may be less than 1 Angstrom in thickness, the change of electrical potential across that distance still amounts to more than 1 volt, and the potential at the position of the origin of the ions and hence the initial energy vary by more than 1 Volt.

High brightness may also be obtained with ion sources of the duoplasmatron type, however, to operate that type of ion source high magnetic fields and large amounts of energy are required. Consequently, the electrodes are operated at very high temperatures resulting in rapid wear and deterioration of the electrode material leading to electrical and mechanical breakdown.

In addition, for both field ionization and duoplasmatron ion sources, a pressure of several mTorr of the gas that is to be ionized must be provided in the ionization space or chamber and the ion beam must be extracted out of the ionization space or chamber through an aperture into the high vacuum region. The escape of unionized gas through this same aperture is oftentimes a nuisance, especially if an ultra-high vacuum is required on the specimen space for work on atomically clean surfaces.

Another use of the ion source of the present invention is in the area of gas flow through metals.

The conventional method of measuring the gas flow is to provide at the vacuum side of the premeation apparatus a mass spectrometer or residual gas analyser. These instruments can detect fluxes as small as $10^{12}$ molecules per second. The field desorption apparatus of the present invention can detect gas fluxes of single ions at rates of 10 counts per second.

SUMMARY OF THE INVENTION

The apparatus and process of the present invention comprises a gas permeable electrode that is exposed at one end to an ionizable gas and exposed at the other end to a high vacuum with all but the tip of the electrode at the high vacuum end coated with a gas impervious coating, the coating at the tip of the electrode being removed previously by field evaporation, and with an extractor electrode spaced apart from the tip of the gas premeable electrode and raised to a negative potential relative to the gas permeable electrode to cause the gas to diffuse through the gas permeable electrode and to be ionized at the surface of the exposed tip of the electrode.

It is, therefore, an object of the present invention to provide a field desorption ion source.

It is a further object of the present invention to provide an ion source having a high brightness.

It is another object of the present invention to provide an ion source having a highly monochromatic energy ion beam.

It is still a further object of the present invention to provide an ion source that uses a gas permeable electrode.

It is still another object of the present invention to provide an ion source that is controllable as to the flow of ionized gas particles.

It is yet another object of the present invention to provide an ion source in which the ionization process occurs at the surface of the electrode tip.

It is yet a further object of the present invention to provide a device for measuring the flow rate of individual gas molecules passing through a gas permeable material.

These and other objects of the present invention will be manifest upon study of the following detailed description when taken together with the drawings.

DESCRIPTION OF THE PREFERRED EMBODIMENT

Figure 1:
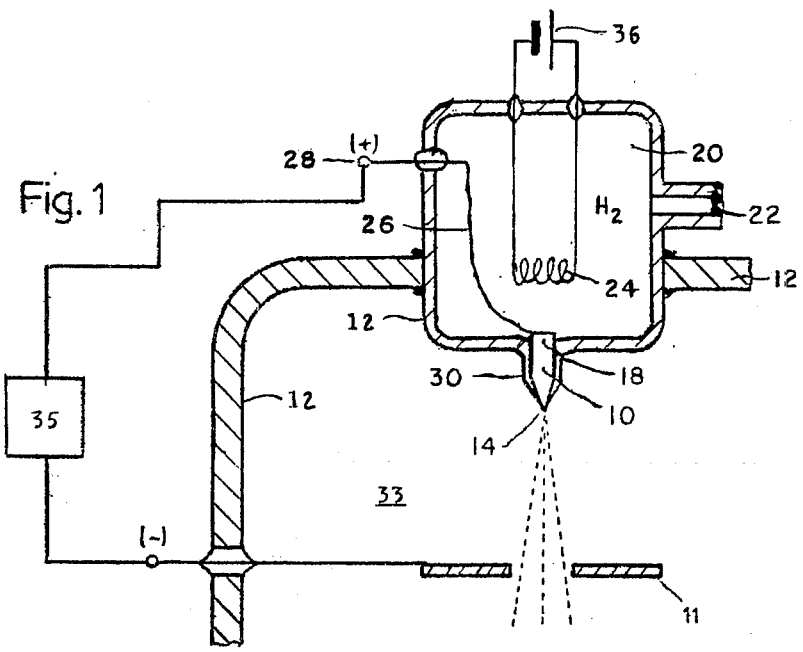
FIG. 1 is a partial elevationl sectional view of the apparatus of the present invention showing the positioning of the gas permeable electrode relative to the high vacuum space and the source of ionizable gas.

With respect to FIG. 1, the ion source apparatus of the present invention comprises, basically, a gas permeable electrode 10 disposed in wall 12 between space 20 containing an ionizable gas, such as hydrogen or deuterium, and the evacuated space 33 enclosed by wall 12. A gas impervious coating 30 is provided on the outer surface of electrode 10 where it is exposed to evacuated space 33, with the exception of tip 14 where the coating has been removed in accordance with the process described below.

Gas entry end 18 of electrode 10 is arranged to be in fluid communication with space 20 and exposed to the gas therein and also connected by wire 26 to the (+) terminal 28.

The (+) terminal 28 is connected to the positive side of a high voltage power source 35, common in the art.

A conduit 22 is provided to supply an ionizable gas to space 20 from a gas supply (not shown) common in the art.

A heater element 24 is provided in space 20 and is connected to power supply or battery 36 to raise end 18 of electrode 10 to a temperature sufficient to assist in the diffusion or flow of the ionizable gas in space 20 into and through electrode 10.

An extraction electrode 11 is provided in evacuated space 33 which is connected to the negative side of power supply 35 to create a potential difference between gas permeable electrode 10 and extraction electrode 11.

Figure 2:
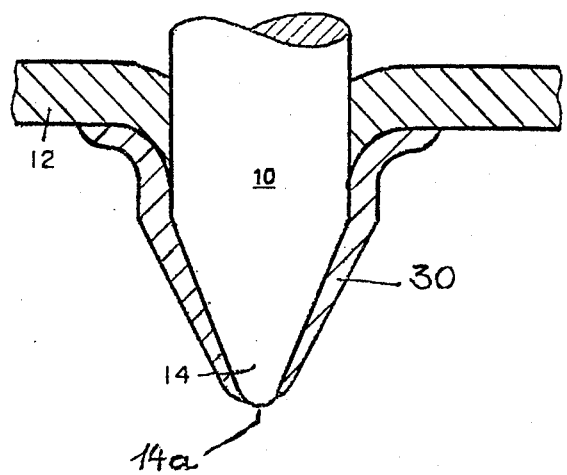
FIG. 2 is an enlarged elevational sectional view of the gas permeable electrode configuration shown in FIG. 1.

With reference to FIG. 2, gas permeable electrode 10 comprises a short thin wire of a material that is permeable to the gas that is to be ionized.

For example, where hydrogen, dueterium or tritium is being ionized, electrode 10 can be fabricated from palladium, vanadium, niobium or tantalum and most of the metals in column VIII of the periodic table of elements: iron, cobalt, nickel, platinum. Where oxygen is being ionized, electrode 10 can be fabricated from silver.

The end of electrode 10 terminating in space 33 is fabricated to define a conical section having a sharply pointed tip 14. The radius of curvature of tip 14 is adapted to be small enough to provide a sufficiently high electric field to cause any gas molecules appearing at the surface 14a of tip 14 to be ionized when a potential difference is applied to electrodes 10 and 11 by power supply 35.

The diffusion or flow rate of ionizable gas into end 18 of gas permeable electrode 10 can be controlled in two ways, either by raising the temperature at end 18 using heater element 24, or by controlling the current flow through wire 26 which can also be fabricated from the same gas permeable material as electrode 10. It has been found that raising end 18 to a temperature of about 300°C. results in a good rate of flow of gas.

Wire 26 offers the surrounding ionizable gas a sufficient surface, approximately 0.1 mm$^2$ for entry of gas and is heated by the electrical current flowing through the wire.

As previously noted, that portion of electrode 10 that is exposed to evacuated space 33 is provided with a gas impervious coating 30, typically, gold or molybdenum or the oxide of the tip material with the exception of tip 14 where the coating is removed.

To fabricate electrode 10, first a length of wire, that will eventually become electrode 10, of a gas permeable material, such as palladium, is soldered, brazed or otherwise sealed into a hole in wall 12 between spaces 20 and 33.

Next, the end of wire 10 within space 33 is immersed in an electolyte solution and a portion of the wire material is progressively removed by etching away the material to obtain a conical shaped end having a very sharp tip 14 possessing a small radius of curvature.

This is generally accomplished by immersing the wire in the electrolyte and applying a high current to the wire through the electrolyte. Where the surface of the electrolyte contacts the wire, a high current density will result in a faster rate of etching, i.e. removal of material. At the moment the wire is completely etched through, the current is immediately turned off and the etching process stopped. The result is a conically shaped tip end having an extremely sharp tip.

Next, the entire end of wire 10, including tip 14, is coated, either by vapor deposition or electrolytic deposition, with a gas impervious material 30 such as gold or molybdenum.

Next, an electrical potential is applied to wire or electrode 10 of such a magnitude as to cause a portion of coating 30 to evaporate by field evaporation. Since the rate of evaporation is proportional to the localized magnitude of the electric field and the magnitude of the electric field is greatest at tip 14, the rate of evaporation will be greatest at tip 14 and cause it to be exposed before the remainder of coating 30 is evaporated from the rest of electrode 10.

As soon as tip 14 becomes exposed, the process is stopped.

To operate the ion source of the present invention shown in FIGS. 1 and 2, space 20 is filled with an ionizable gas such as hydrogen.

Heater element 24 is energized to the desired operating temperature, in the case of hydrogen, about 300°C.

A negative potential is then applied to extraction electrode 11 with respect to gas permeable electrode 10, for example, 10 Kv.

Under these conditions, electrode 10 is loaded with hydrogen at end 18. The hydrogen then diffuses to tip 14, as can be seen in FIG. 3, as represented by dashed lines 32.

Upon reaching tip 14, the hydrogen molecule is field desorbed by the high electrical field and ionized at surface 14a.

Since desorption and ionization occur at the emitting surface 14a of tip 14, the ions are all created at very closely the same potential, that is, the equipotential of that surface.

Figure 3:
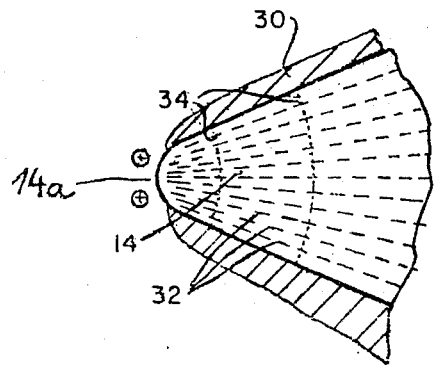
FIG. 3 is an enlarged sectional view of the gas permeable electrode of FIGS. 1 and 2 graphically illustrating the flow of gas molecules through the electrode and the ionization process occurring at the tip of the electrode.

As can be seen from FIG. 3, the flux lines 32, shown dashed, for the hydrogen molecules in electrode 10, are all converging and concentrating at tip 14 and emerge at emitting surface 14a, which, in practice, covers an area of approximately $10^{-10}$cm$^{-2}$.

Dotted lines 34 represent lines of equal gas flux density in electrode 10.

It can also be seen that the flow rate of ionizable gas can be controlled through control of the temperature of electrode 10 and thus the diffusion rate of gas into electrode 10 can be controlled.

Additionally, through the use of a counting technique common in the art of particle physics, individual ions created at tip 14 and flowing to extraction electrode 11 can be detected, thus measuring very small flux rates of gas permeating through the material of electrode 10.

Although, in the above example, palladium is used as the electrode material, other materials can be selected depending upon their particular diffusion rate for the particular gas being ionized.

I claim:

1. A method of fabricating a gas permeable electrode comprising the steps of etching the end of a gas permeable wire to a point, covering said etched end of said wire with a gas impervious coating, applying an electrical potential to said etched and coated wire in an evacuated space until the coating on said point is removed by field evaporation.

2. The method of fabricating a gas permeable electrode as claimed in claim 1 wherein the step of covering said etched end of said wire with a gas impervious coating comprises the steps of placing said etched end of said wire in an electrolytic solution, electrodepositing on said etched end a gas impervious coating.

3. The method of fabricating a gas permeable electrode as claimed in claim 1 wherein the step of covering said etched end of said wire with a gas impervious coating comprises the steps of placing said etched end of said wire in an evacuated space, vapor depositing a gas impervious coating on said etched end of said wire.

* * * * *